US008004197B2

(12) United States Patent
Erckmann et al.

(10) Patent No.: US 8,004,197 B2

(45) Date of Patent: Aug. 23, 2011

(54) METHOD AND APPARATUS FOR COLLECTOR SWEEPING CONTROL OF AN ELECTRON BEAM

(75) Inventors: Volker Erckmann, Lubmin (DE); Günter Dammertz, Graben-Neudorf (DE); Martin Schmid, Eggenstein-Leopoldshafen (DE)

(73) Assignees: Max-Planck-Gesellschaft zur Förderung der Wissenschaften e.V. (DE); Karlsruher Institut für Technologie (DE)

( * ) Notice: Subject to any disclaimer, the term of this patent is extended or adjusted under 35 U.S.C. 154(b) by 113 days.

(21) Appl. No.: 12/598,799

(22) PCT Filed: May 4, 2007

(86) PCT No.: PCT/EP2007/003958

§ 371 (c)(1), (2), (4) Date: Nov. 24, 2009

(87) PCT Pub. No.: WO2008/135064

PCT Pub. Date: Nov. 13, 2008

(65) Prior Publication Data

US 2010/0140493 A1 Jun. 10, 2010

(51) Int. Cl.

*H01J 3/14* (2006.01)
*H01J 37/256* (2006.01)
*H01J 25/10* (2006.01)

(52) U.S. Cl. ................. 315/5.38; 315/5.35; 315/111.41; 315/111.81; 250/396 R; 250/493.1; 331/4; 331/80

(58) Field of Classification Search .............. 250/396 R, 250/493.1; 315/5.38, 5.35, 111.41, 111, 315/81; 331/4, 80

See application file for complete search history.

(56) References Cited

U.S. PATENT DOCUMENTS

| | | | | |
|---|---|---|---|---|
| 5,134,341 | A * | 7/1992 | Jodicke et al. | 315/5 |
| 5,138,230 | A | 8/1992 | Juedicke et al. | |
| 7,750,572 | B2 * | 7/2010 | Bariou et al. | 315/3 |
| 2009/0102383 | A1 | 4/2009 | Bariou et al. | |

FOREIGN PATENT DOCUMENTS

| | | | |
|---|---|---|---|
| EP | 0 324 667 | A | 7/1989 |
| FR | 991 127 | A | 10/1951 |
| RU | 1835099 | | 8/1993 |

(Continued)

OTHER PUBLICATIONS

Saraph G. P. et al., "A Comparative Study of Three Single-Stage, Depressed-Collector Designs for a 1-MW, CW Gyrotron," IEEE Service Center, Piscataway, NJ, US, vol. 28, No. 3, Jun. 2000, pp. 830-840, XP001080021 ISSN: 0093-3813.

(Continued)

*Primary Examiner* — Nikita Wells

(74) *Attorney, Agent, or Firm* — DLA Piper LLP (US)

(57) ABSTRACT

A collector sweeping method for controlling an electron beam in a beam collector, in particular of a magnetic gyrotron device, comprises the steps of subjecting the electron beam to a transversal sweeping field having a field component perpendicular to a longitudinal direction (z) of the beam collector and providing a tilted, rotating intersection area of the electron beam in the beam collector, and varying at least one of a longitudinal position and a tilting angle of the intersection area by a modulation of the transversal sweeping field. Furthermore, a collector sweeping apparatus and a microwave generator are described.

20 Claims, 3 Drawing Sheets

FOREIGN PATENT DOCUMENTS

| | | | |
|---|---|---|---|
| RU | 2010384 | | 3/1994 |
| SU | 1243045 | | 7/1986 |
| WO | WO 2006/045766 | A1 | 5/2006 |

OTHER PUBLICATIONS

Dammertz, G. et al., "Collector Sweeping Systems for High Power Gyrotrons," Infrared and Millimeter Waves and 13th International Conference on Terahertz Electronics,2005. Irmmw-THZ 2005. The Joint 30th International Conference on Williamsburg, VA, USA 19-23, Sep. 2005, pp. 293-294, XP010875042 ISBN: 0-7803-9348-1.

S. Alberti et al., "European High-Power CW Gyrotron Development for ECRH Systems," in "Fusion Engineering and Design," vol. 53, 2001, pp. 387-397.

* cited by examiner

METHOD AND APPARATUS FOR COLLECTOR SWEEPING CONTROL OF AN ELECTRON BEAM

RELATED APPLICATION

This is a §371 of International Application No. PCT/EP2007/003958, with an international filing date of May 4, 2007 (WO 2008/135064 A1, published Nov. 13, 2008).

TECHNICAL FIELD

The disclosure relates to a collector sweeping method, in particular for controlling an electron beam in a beam collector of a vacuum device, like a vacuum tube of a microwave generator. Furthermore, the disclosure relates to a method of microwave generation with a microwave generator including collector sweeping of an electron beam. Furthermore, the disclosure relates to a collector sweeping apparatus and a microwave generator being adapted for implementing the above methods.

BACKGROUND

The generation of microwaves using electron tubes, in particular using a free electron maser, gyrotron or klystron, is generally known. As an example, a gyrotron includes an electron source for generating a hollow beam of highly accelerated electrons and a cryomagnet resonance device for forcing the electrons into a cyclotron motion, wherein the microwave is emitted. A beam collector is provided for collecting the electron beam after separation of the microwave with a microwave optic. The beam collector is adapted not only for absorbing the electric current represented by the electron beam, but rather for dissipating waste power, which has been kept in the electron beam after the microwave emission.

Heat dissipation in beam collectors represents a serious problem in particular with high power microwave generators. As an example, high power millimeter wave vacuum tubes operate with a radio frequency (rf) power of typically 1 MW in cw-mode with an efficiency of 30% to 50%. In this range of efficiencies, typically 1 to 2 MW power remains in the electron beam after the microwave generation. This remaining power must be dissipated as waste power in the beam collector. The beam collector typically is made from copper with a cylindrical shape. Electrons are guided by an axis symmetric strong stationary magnetic field (typically 5-6 T) through an entrance area into the axis-symmetric collector. The diverging magnetic field lines and thus the drifting electrons intersect at some vertical position with the collector wall. The intersection area (strike area) forms a horizontal ring with a typical power density of e.g. 20 $MW/m^2$. Although copper as excellent cooling properties and a sophisticated water-cooling system is integrated into the beam collector wall, this power density is far beyond existing cooling technology. With a continuous operation, this power density would lead to melting of the beam collector.

For avoiding damage to the beam collector, available gyrotrons are adapted for a collector sweeping technique (magnetic field sweeping technique, see e.g. S. Alberti et al. "European high-power CW gyrotron development for ECRH systems" in "Fusion Engineering and Design" vol. 53, 2001, p. 387-397). Generally, collector sweeping comprises superimposing the stationary diverging magnetic field with a magnetic sweeping field, which sweeps (continuously moves, deflects) the hollow electron beam over the inner wall of the beam collector to reduce the local power density in a time average (FIGS. 5A and 5B).

In particular, FIGS. 5A and 5B illustrate a cylindrical beam collector 230' of a conventional gyrotron (not completely shown). The hollow electron beam 1' is directed to the beam collector 230' along the longitudinal (axial) extension thereof (parallel to the positive z-direction). With the diverging magnetic field 2', the electron beam 1' is directed to the inner walls of the beam collector 230'. Without sweeping, the intersection area 3' formed by the electron beam 1' with the inner wall of the beam collector 230' would be a circular area as shown with the central dotted ring in FIG. 5A.

According to FIG. 5A, collector sweeping is provided by a vertical sweeping coil 22' surrounding the outer wall of the beam collector 230' and extending along the longitudinal extension thereof. With the vertical sweeping coil 22', a vertical sweeping field is created adding a periodically alternating axial vector component (z-component) to the diverging magnetic field (Vertical Field Sweeping System, hereinafter "VFSS"). As a result, the electron beam 1' is swept along the inner wall of the beam collector 230'. The intersection area 3' formed by the electron beam 1' is a shifting circular area. Dashed rings in FIG. 5A mark the upper and lower turning points 4' of the deflected the electron beam 1'.

The VFSS has a general disadvantage in terms of low electrical efficiency. The copper wall of the beam collector 230' represents a single turn, short-circuited coil efficiently shielding the vertical sweeping field. Powerful AC-power supplies in connection with large, water cooled sweep coils are required to provide the necessary sweeping capability. This disadvantage can be avoided with the conventional collector sweeping method illustrated in FIG. 5B (Transverse Field Sweep System, hereinafter "TFSS").

With TFSS, collector sweeping is provided by transversal sweeping coils 11'. In this case, a transversal sweeping field is created adding a rotating horizontal vector component to the diverging magnetic field. With the transversal sweeping field, the intersection area of the electron beam 1' is a rotating ellipse. As a small distortion perpendicular to the z-direction is enough for an efficient deflection of the electron beam, the transversal sweeping coils 11' can be positioned in front of an entrance area of the beam collector 230' so that the above shielding problem of the VFSS technique is significantly reduced. Furthermore, this section of the gyrotron is built from stainless steel rather than copper with reduced conductivity.

A general problem of both VFSS and TFSS techniques is related to the so-called power peaking during the sweeping period. FIG. 6 illustrates vertical power density profiles of the collector temperature increase for the VFSS technique (dots) and the TFSS technique (dashes). While the vertical sweeping results in two power peaks at the turning points 4' (FIG. 5A) of the sweeping period, the transversal sweeping shows a single power peak at the lower limitation (near the entrance area of the beam collector). The power peaking represents a main disadvantage, because the power density in the maximum of the power distribution determines the overall collector capability.

Generally, there is an interest to reduce the power peaking not only in gyrotron beam collectors, but rather in any beam collector of a high-power vacuum device, as it is applied e.g. in other microwave generators, in particular for the purpose of heating a plasma in a fusion reactor.

It could therefore be helpful to provide improved collector sweeping methods and apparatuses for controlling an electron beam in a beam collector avoiding the disadvantages and restrictions of the conventional techniques.

SUMMARY

According to a first aspect, the present disclosure is based on the general technical teaching of providing a collector sweeping method for controlling an electron beam in a beam collector, wherein a transversal sweeping field is modulated for a continuous variation of a position and/or orientation of the sweeping electron beam in the beam collector. According to a second aspect, the present disclosure is based on the general technical teaching of providing a collector sweeping apparatus adapted for controlling an electron beam in a beam collector, wherein a transversal sweeping coil device of the collector sweeping apparatus is provided with a modulating device being arranged for a position and/or orientation modulation of the transversal sweeping field. Further independent aspects comprise a method of microwave generation and a microwave generator including the collector sweeping technique.

According to the disclosure, the transversal sweeping field is modulated. The transversal sweeping field is a rotating magnetic field having at least one vector component perpendicular to a longitudinal direction of the beam collector. The transversal sweeping field deflects the electron beam such that a tilted, rotating intersection area is formed in the beam collector. Advantageously, the modulation of the transversal sweeping field results in a continuous variation of the longitudinal (in particular axial) position and a tilting angle of the intersection area. Accordingly, the pronounced power deposition maxima (power peaking) occurring with the conventional technique can be avoided, and a homogenous distribution of waste power is obtained. With the modulation, the heating profile along the longitudinal direction of the beam collector is broadened, so that the power peaking is reduced. In particular, the power density at the turning point of the intersection area near the entrance area of the beam collector (proximate or lower turning point) is essentially reduced as the proximate turning point is repeatedly (such as periodically) moved due to the modulation of the transversal sweeping field.

As an advantage, a collector sweeping system, which generates a homogenous power distribution along the whole heating profile is provided for the first time. The disclosed collector sweeping has particular advantages for vacuum tubes being adapted for generating a microwave output power above 1 MW, in particular above 2 MW. However, the disclosed collector sweeping also has advantages for the conventional rf-tubes, because they can be designed more economically (in particular with smaller collectors) or operated with higher safety margin and/or extended lifetime.

According to a first example, the transversal sweeping field is modulated by superimposing the transversal sweeping field with a vertical sweeping field. Advantageously, the intersection area, e.g. the intersection ellipse in a cylindrical beam collector, is shifted up and down (or forward and backward), so that the peaks of the power deposition profile along the longitudinal extension of the beam collector are smoothed out. As a particular advantage, available hardware can be used for providing an exemplar collector sweeping. In particular, available vertical field coil devices can be combined with a transversal field coil device for generating the modulated transversal sweeping field.

The first example has a particular advantage in terms of reducing power peaking without generating new "hot spots". The modulation of the transversal sweeping field with the vertical sweeping field yields not only a shifting of power peaking but rather real attenuation. Due to the frequency dependent contributions of the thick collector wall (skin effect), the superposition of transversal and vertical sweeping fields is a non-linear process. Therefore, in consideration of the complex interaction of superimposed divergent time dependent fields in presence of shielding and deformation effects by the collector wall, in particular copper wall, the power peaking attenuation represents a surprising and advantageous result.

According to a second example, the transversal sweeping field is subjected to an amplitude modulation. In this case, the tilting angle of the rotating intersection area is modulated, so that the power peaks of the power density profile are smoothed out. The second example has the additional advantage of technical simplicity. A vertical field coil system is not required for implementing the amplitude modulation of the transversal sweeping field.

According to a further example, the transversal sweeping field can be modulated with both of the vertical sweeping field according to the above first example and the amplitude modulation according to the above second example. Advantageously, this combination allows a further improvement of the power density profile within the beam collector.

For implementing these examples, the collector sweeping apparatus of the disclosure comprises a vertical field coil device being arranged for superimposing the transversal sweeping field with the vertical sweeping field, and/or an amplitude modulation device being connected with the transversal sweeping coil device for subjecting the transversal sweeping field to an amplitude modulation.

Further advantages are obtained if the transversal sweeping and the modulation of the transversal sweeping field are effected on different time scales. For example, a transversal sweep frequency, which typically is the rotation frequency of the transversal sweeping field, is larger than the vertical sweep frequency of the modulating vertical sweeping field and/or the amplitude modulation frequency. With this example, the power deposition profiles are smoothed out by a slow vertical displacement and/or tilting of the intersection area. According to certain variants, the intersection area of the electron beam rotates at least 2 times, particularly preferred at least 5 times until one vertical cycle (first embodiment) or tilting cycle (second embodiment) is completed. In other words, the ratio of the transversal sweep frequency and the vertical sweep frequency (or amplitude modulation frequency) is preferably larger than 2, particularly preferred larger than 5.

Further advantages with the above second example are obtained, if the amplitude modulation has a modulation depth smaller than 70%, in particular equal or smaller than 50%. With these parameters, homogenous power deposition profiles have been further optimized.

Typically, the vertical sweeping field modulating the transversal sweeping field (first example) can be generated with a vertical field coil device extending along the longitudinal direction of the beam collector, possibly even around the entrance area thereof. In this case, improved smoothing of the power peaking distant from the entrance area can be obtained. However, according to a particular advantage, the vertical field coil device is be restricted to a vertical field coil (so-called entrance area coil) arranged at the entrance area of the beam collector. The inventors have found that generating the vertical sweeping field for modulating the transversal sweeping field exclusively by the entrance area coil is suitable for smoothing the proximate power peaking. With the provision of the entrance area coil only, the structure of the collector sweeping device is essentially simplified. The disadvantages of low efficiency of the conventional VFSS technique are avoided.

A further advantage of the collector sweeping technique is given by the capability of using various arrangements of transversal field coils selected in dependence on the particular application. For example, at least two transversal field coils are arranged just before the entrance area of the beam collector. Only two transversal field coils are enough for providing a switching transversal sweeping field, which is modulated with the vertical sweeping field and/or amplitude modulation. Preferably, an arrangement of three or six transversal field coils is provided resulting in advantages in terms of field uniformity. According to a particular example, three pairs of transversal field coils are arranged with a relative displacement of 120°. With a pair-wise excitation of the coils, a rotating magnetic field for transversal sweeping is obtained.

Another advantage of the improved operation safety of the disclosed collector sweeping is given by the fact that there are no particular requirements as to a control of the sweeping fields. Parameters of transversal and vertical sweeping, in particular transversal sweep frequency, vertical sweep frequency, amplitude modulation frequency, vertical sweep amplitude, shape of amplitude modulation and/or modulation depth, can be adjusted in dependence on the features of the beam collector, in particular cooling capacity, dimensions, and the operation conditions, like e.g. electrical current of the electron beam. However, according to a modified example, a feedback control of at least one of the transversal and vertical sweeping fields can be implemented. With this variant, the collector sweeping method includes a step of temperature detection for obtaining a temperature distribution in the beam collector and a further step of controlling at least one of the transversal sweeping field and the modulation of the transversal sweeping field in dependence on the detected temperature distribution. For collecting temperature data, a plurality of thermoelectric sensors may be used.

BRIEF DESCRIPTION OF THE DRAWINGS

Further details and advantages are described in the following with reference to attached drawings, which show in.

DETAILED DESCRIPTION

With the following description of exemplary embodiments, reference is made to an application of the disclosed collector sweeping for controlling an electron beam in a high power gyrotron. It is emphasized that the application is not restricted to gyrotrons, but rather possible with other vacuum devices including a beam collector for collecting an electron beam, like e.g. other vacuum devices with magnetic field guided electron beam dumps with high power density like e.g. Free Electron Masers (FEM) or Free electron Lasers (FEL). Furthermore, exemplary reference is made to the application with a cylindrical beam collector, wherein the electron beam is periodically swept along the longitudinal extension of the inner wall of the beam collector. The disclosed collector sweeping can be implemented with a different beam collector design in an analogue way. As an example, the inner wall of the collector can be adapted for a glancing incidence of the electron beam on a funnel-shaped collector wall. With the following examples, a periodically rotating transversal sweeping field having a predetermined transversal sweep frequency is assumed. The disclosure can be implemented with a non-uniform rotation or a stepwise changing of the direction of the transversal sweeping field in an analogue way.

Figure 1:
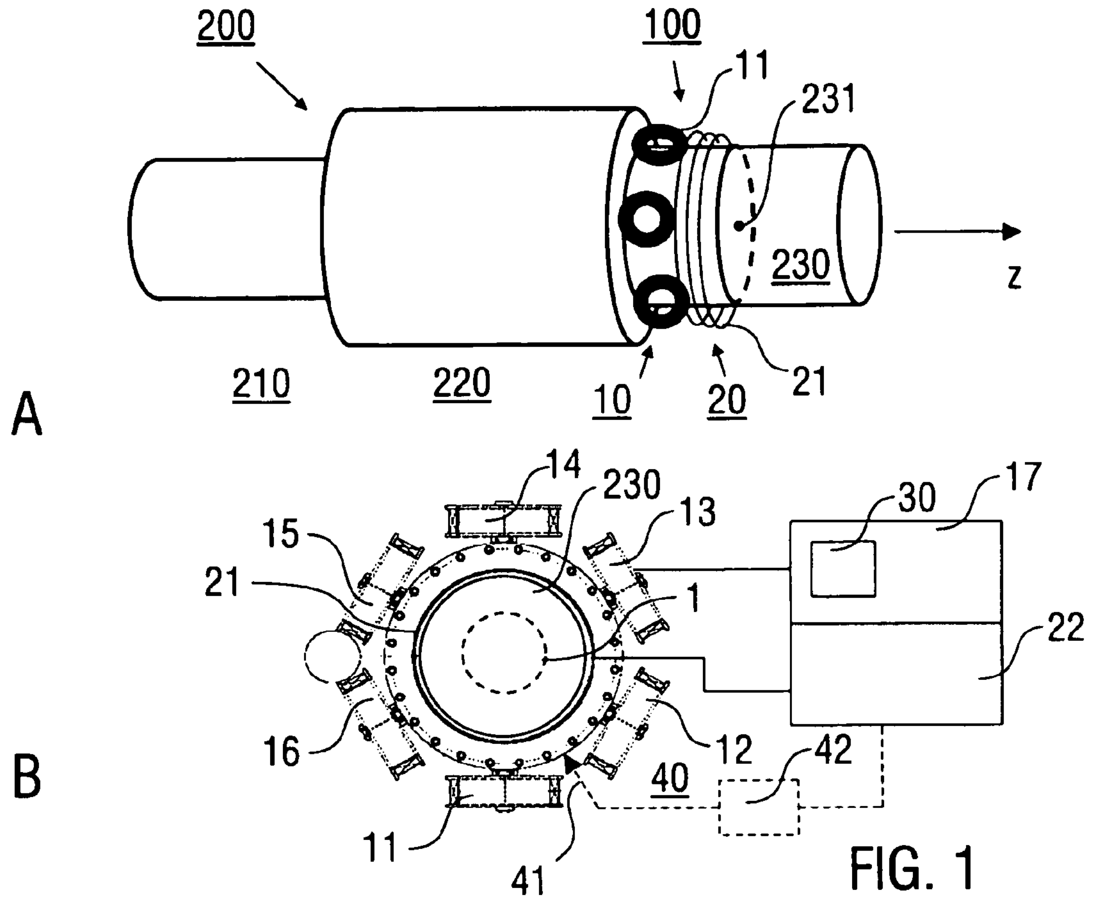
FIGS. 1 to 3 are schematic illustrations of exemplary variations.

FIG. 1 schematically illustrates an exemplary embodiment of a microwave generator 200 (FIG. 1A), which is equipped with a collector sweeping apparatus 100, details of which being illustrated in the schematic top view of FIG. 1B. The microwave generator 200 includes an electron gun 210, a cryomagnet resonance device 220 and a cylindrical beam collector 230. Microwave generator 200 is e.g. a high-power gyrotron, like a commercial THALES gyrotron TH1507 (SNo. 3), adapted for cw operation with a gyrotron frequency in the range of, for example, 100 to 140 GHz and an output power of about 1 MW. After the electron beam—wave interaction with an efficiency of about 45%, the electrons have an energy of about 80 to 100 keV. The cylindrical beam collector 230 has a longitudinal length of about 1 m and a diameter of about 0.5 m.

The longitudinal direction of electron transport in the microwave generator 200, in particular into the beam collector 230 and the axial direction of the beam collector is referred to as z-direction. The radial directions (x- and y-directions) are oriented perpendicular relative to the z-direction.

The collector sweeping apparatus 100 is arranged at the entrance side of the beam collector 230, e.g. at an axial position between the cryomagnet resonance device 220 and the beam collector 230, in particular directly before the entrance area 231. Depending on the example, the collector sweeping apparatus 100 comprises a combination of a transversal sweeping coil device 10 with a vertical sweeping coil device 20 (first example) or exclusively the transversal sweeping coil device 10 (in combination with an amplitude modulation device 30, second example), or a combination of a transversal sweeping coil device 10 with both of the vertical sweeping coil device 20 and the amplitude modulation device 30.

The transversal sweeping coil device 10 comprises e.g. six transversal sweeping coils 11 to 16. FIG. 1B shows the top view of the coil layout around the beam collector 230. Coils 11 to 16 may be designed and arranged as described in the publication of G. Dammertz et al. in "Proc. of the Joint 30th Int. Conf. on Infrared and Millimeter Waves and 13 th Int. Conf. On Terahertz Electronics", Williamsburg, USA, ISBN 0-7803-9349-X (2005) p. 323-324. The transversal sweeping coils 11 to 16 are excited in pairs (11-14, 12-15, 13-16), thus creating the magnetic transversal sweeping field. The transversal sweep frequency is selected to be e.g. 50 Hz to simplify the Power Supply (50 Hz is european mains-standard), i.e. the magnetic transversal sweeping field rotates 50 times per second. The transversal sweeping coils 11 to 16 are designed in consideration of the available space around the gyrotron, the required magneto motive force, the cooling requirements for continues operation and manufacturing considerations. For avoiding vibration damage due to the AC operation in the static magnetic field of the cryomagnet resonance device 220, the coils are tightly wound (voids filled). Each of the coils 11 to 16 is provided with a water cooled copper jacket keeping the temperature of the coil below 80° C. Each coil is designed to deliver a magneto motive force of e.g. 8 kA turns. Typical dimensions of coils 11 to 16 are: outer dimensions: 322×245×90 mm, winding (copper) 200 turns (10 layers), wire cross section: 2.24×3.55 mm→7.4 mm$^2$, current: 30 A (21.2 $A_{rms}$) (2.88 $A_{rms}$/mm$^2$), voltage: 72 $V_{rms}$, total resistance: 0.36 Ohms at 20° C., Ohmic losses: 20° C.→162 W, 120° C.→225

W, max. permissible insulation temperature 200° C., inductance: 12 mH, copper weight: 11 kg, total weight: 17 kg, coil former: austenitic stainless steel, magnetic field at centre of coil: 21 mTesla. Each of the coils 1 to 16 is connected with a transversal sweeping field power supply 17, which comprises e.g. a variable 3-phase transformer providing a current of 23 A in each transversal sweeping coil. The electron beam 1 (dashed circle) is axis-symmetric and hollow with a diameter of approximately 100 mm.

The vertical sweeping coil device 20 comprises a cylindrical vertical sweeping coil 21 connected with a vertical sweeping power supply 22. The coil 21 is arranged with axis-symmetry around the path of the electron beam 1 just before the entrance area 231 of the beam collector 230. As an aspect of this example, the axial length of the vertical sweeping coil 21 can be selected essentially shorter compared with the conventional VFSS-coil. As an example, the vertical sweeping coil 21 may comprise a few turns, e.g. below 10 turns or even one turn only. Accordingly, the power consumption and the costs of the vertical sweeping coil can be essentially reduced. The vertical sweeping coil power supply 22 comprises an AC power supply adapted for providing an AC current for exciting the vertical sweeping coil 21. The AC current is selected in dependence on the coil design and the magnitude of the stationary magnetic field.

The amplitude modulation device 30, which may be integrated into the transversal sweep power supply 17, is schematically illustrated FIG. 1B as well. The amplitude modulation device 30 is adapted for creating a low frequency amplitude modulation (e.g. 7 Hz), which has a triangular envelope and typically 50% modulation depth.

As an exemplary operation mode, the coil currents in both transversal and vertical sweeping field devices can be adjusted with supplies 17, 22 to maintain the same overall beam spreading, i.e. with increasing transversal sweeping field amplitude, the vertical sweeping field amplitude is reduced.

FIG. 1B further illustrates a feedback loop 40, which optionally can be provided for controlling the disclosed collector sweeping. The feedback loop 40 includes a plurality of temperature sensors 41 and a control circuit 42. As an example, 49 temperature sensors (thermocouples) are mounted at equal distances along the vertical direction of the beam collector 230. The temperature rise is measured as a function of the vertical distance from the entrance area 231. The control circuit 42 is adapted for evaluating the temperature data obtained with a temperature sensors 41 and for creating a control signal for at least one of the transversal and vertical sweep power supplies 17, 22. As an example, if the temperature in a region distant from the entrance area 231 increases above a predetermined threshold value, control circuit 42 effects an increased amplitude of the vertical sweeping field created with coil 21.

Figure 2:
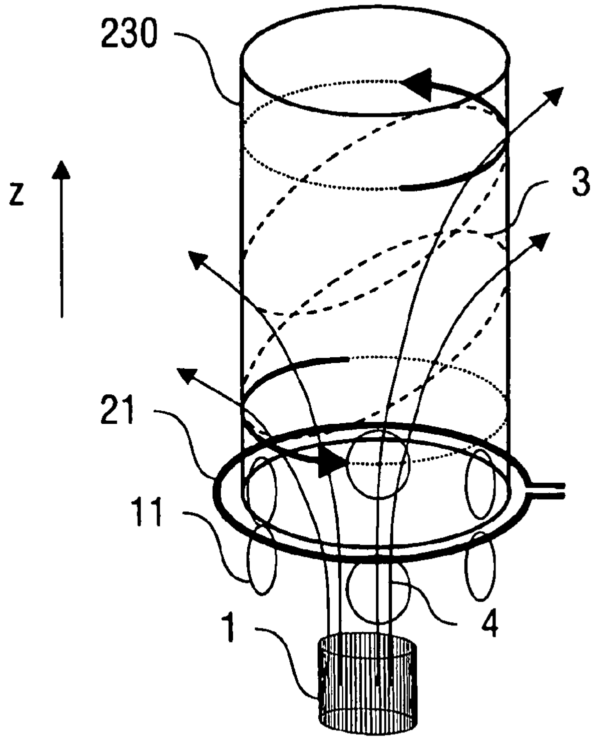
Figure 3:
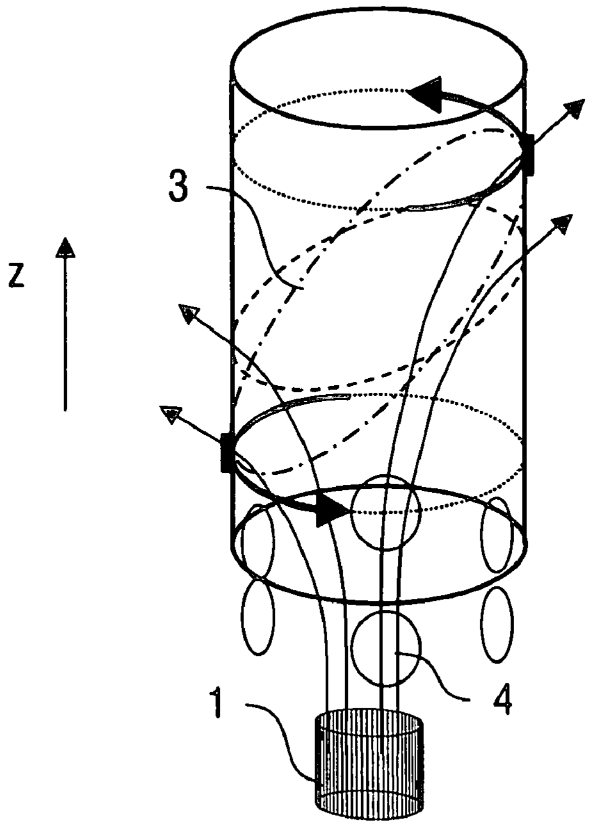
Figure 5:
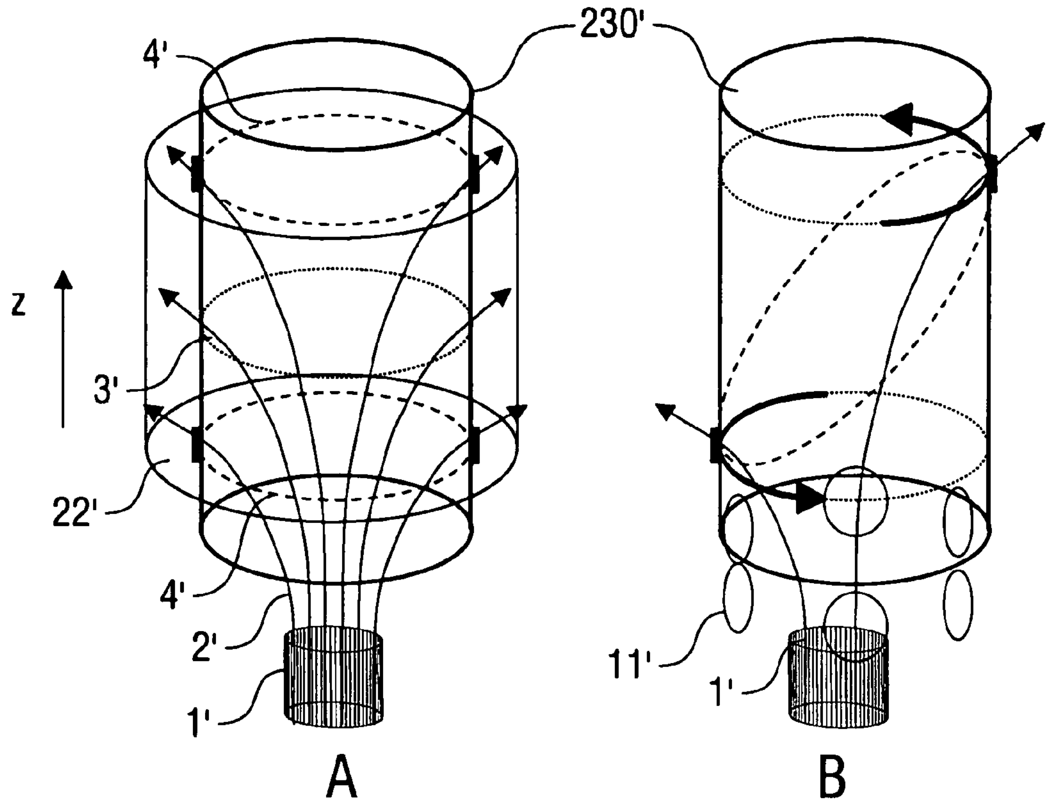
FIG. 5 (Prior Art)
FIGS. 5 and 6 are illustrations of conventional techniques (prior art).

While the transversal sweeping coil device 10 creates an elliptic intersection area of the sweeping electron beam as with the prior art technique (see FIG. 5B), the disclosed modulation of the transversal sweeping field results in a variation of the intersection area 3 as schematically illustrated in FIGS. 2 and 3.

FIG. 2 schematically illustrates the axial movement of intersection area 3 (strike-line ellipse) under the influence of the low frequency vertical sweeping field created e.g. with a single turn or multiple turn entrance area coil 21. The intersection area 3 formed by static diverging magnetic field 4 and the transversal sweeping field is shifted up and down. The ellipse rotates many times (typically, in certain examples, 10 times) until one vertical cycle is completed. A homogenous power deposition profile is obtained by adjusting the amplitude and frequency of the vertical and transversal sweeping systems in dependence on the operation parameters of the microwave device 200.

According to FIG. 3, a low frequency amplitude modulation of the transversal sweeping field results in a slowly modulation of the tilt angle of the rotating strike line ellipse, thus smoothing out the peaks of the power deposition profile. According to the disclosure, both embodiments of FIGS. 2 and 3 can be combined for inducing a more complex movement of the intersection area in the beam collector 230.

Figure 4:
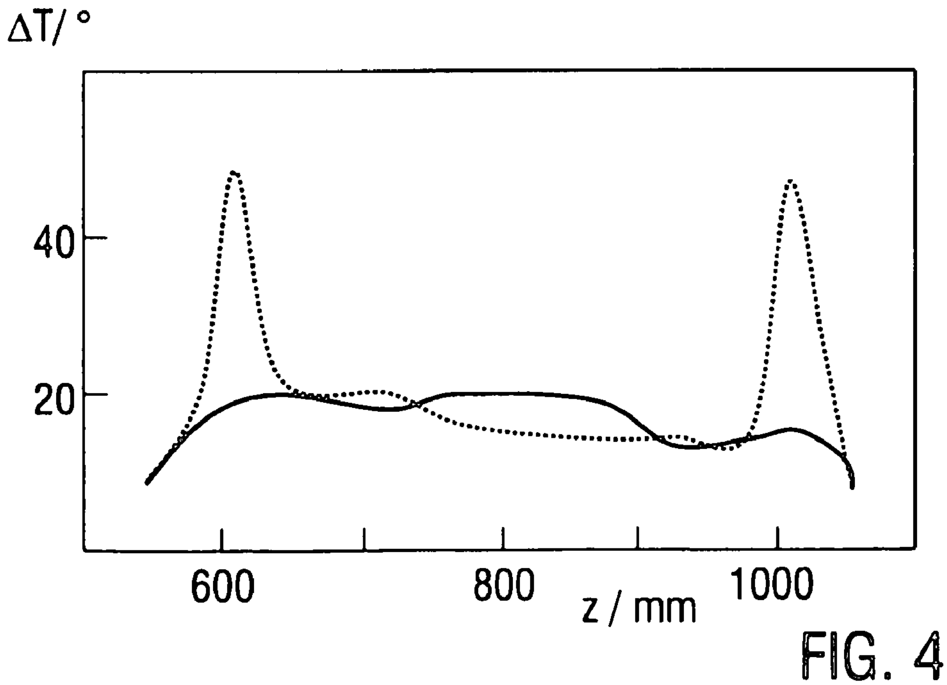
FIG. 4 is a graphical representation of an exemplary power density profile.
Figure 6:
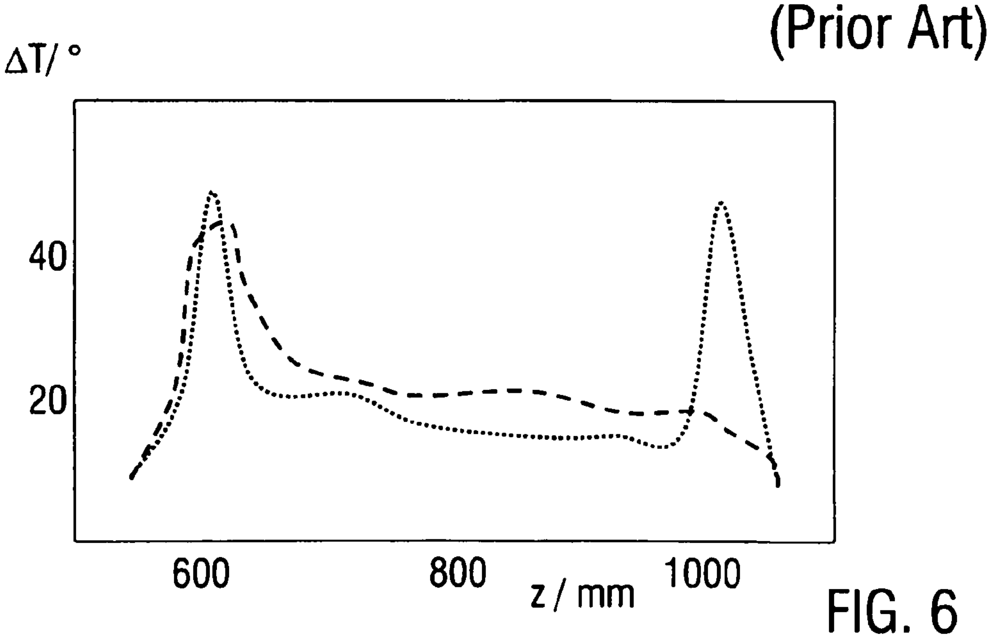
FIG. 6 (Prior Art)

FIG. 4 illustrates an experimental result obtained with the inventive collector sweeping method. The smooth power deposition profile (solid line) obtained is compared with the profile with double power peaking of the conventional VFSS-technique (dotted line, see FIG. 6). According to FIG. 4, a reduction of the peak loading by almost a factor of two has been obtained, thus enhancing the collector capability by the same amount. An additional improvement of the power density profile has been achieved by providing a fine tuning of the transversal sweeping field modulation with a fine tuning DC-magnetic field, which shifts the lower turning point of the intersection area 3 slightly apart from the entrance area.

The features disclosed in the above description, the drawings and the claims can be of significance both individually as well as in combination for the realization of the aspects disclosed and its various forms.

The invention claimed is:

1. A collector sweeping method for controlling an electron beam in a beam collector, comprising the steps of:

subjecting the electron beam to a transversal sweeping field having a field component perpendicular to a longitudinal direction (z) of the beam collector and providing a tilted, rotating intersection area of the electron beam in the beam collector, and varying at least one of a longitudinal position and a tilting angle of the intersection area by a modulation of the transversal sweeping field.

2. A collector sweeping method according to claim 1, wherein the modulation of the transversal sweeping field comprises at least one of:

superimposing the transversal sweeping field with a vertical sweeping field, and subjecting the transversal sweeping field to an amplitude modulation.

3. A collector sweeping method according to claim 2, wherein a transversal sweep frequency of the transversal sweeping field is larger than a vertical sweep frequency of the vertical sweeping field or an amplitude modulation frequency of the amplitude modulation.

4. A collector sweeping method according to claim 3, wherein a quotient of the transversal sweep frequency and the vertical sweep frequency or amplitude modulation frequency is larger than 2.

5. A collector sweeping method according to claim 2, wherein the amplitude modulation has a modulation depth smaller than 70%.

6. A collector sweeping method according to claim 1, wherein the transversal sweeping field is generated with at least two transversal field coils circumferentially arranged at an entrance area of the beam collector.

7. A collector sweeping method according to claim 6, wherein the transversal sweeping field is generated with three pairs of the transversal field coils.

8. A collector sweeping method according to claim 2, wherein the vertical sweeping field is generated with a vertical field coil device being positioned at an entrance area of the beam collector.

9. A collector sweeping method according to claim 2, wherein the vertical sweeping field is generated with a vertical field coil device extending along the longitudinal direction (z) of the beam collector.

10. A collector sweeping method according to claim 1, comprising the steps of:

detecting a temperature distribution in the beam collector, and controlling the modulation of the transversal sweeping field in dependence on the detected temperature distribution.

11. A method of generating a microwave, comprising the steps of generating an electron beam, subjecting the electron beam to a magnetic gyrotron field for generating the microwave, and collecting the electron beam, wherein the electron beam is subjected to a collector sweeping method according to claim 1.

12. A collector sweeping apparatus being arranged for controlling an electron beam in a beam collector, comprising:

a transversal sweeping coil device being arranged for generating a transversal sweeping field directed perpendicular to a longitudinal direction (z) of the beam collector and providing a tilted, rotating intersection area of the electron beam in the beam collector, and a modulating device being arranged for a modulation of the transversal sweeping field such that at least one of a longitudinal position and a tilting angle of the intersection area is varied.

13. A collector sweeping apparatus according to claim 11, wherein the modulating device comprises at least one of:

a vertical field coil device being arranged for superimposing the transversal sweeping field with a vertical sweeping field, and an amplitude modulation device being connected with the transversal sweeping coil device for subjecting the transversal sweeping field to an amplitude modulation.

14. A collector sweeping apparatus according to claim 12, wherein the modulating device is adapted for controlling a transversal sweep frequency of the transversal sweeping field to be larger than a vertical sweep frequency of the vertical sweeping field or an amplitude modulation frequency of the amplitude modulation.

15. A collector sweeping apparatus according to claim 13, wherein the modulating device is adapted for controlling the transversal sweep frequency such that a quotient of the transversal sweep frequency and the vertical sweep frequency or amplitude modulation frequency is larger than 2.

16. A collector sweeping apparatus according to claim 11, wherein the transversal sweeping coil device comprises at least two transversal field coils circumferentially arranged around an entrance area of the beam collector.

17. A collector sweeping apparatus according to claim 15, wherein the transversal sweeping coil device comprises three pairs of the transversal field coils.

18. A collector sweeping apparatus according to claim 12, wherein the vertical sweeping coil device comprises at least one of an entrance area coil surrounding the entrance area of the beam collector and a vertical sweeping coil extending along the longitudinal direction (z) of the beam collector.

19. A collector sweeping apparatus according to claim 12, further comprising a feedback loop for controlling at least one of the transversal sweeping field and the vertical sweeping field in dependence on the temperature of the beam collector.

20. Microwave generator, comprising:

an electron beam source for generating an electron beam, a cryomagnet resonance device for subjecting the electron beam to a magnetic gyrotron field for generating a microwave, and a beam collector being arranged for collecting the electron beam, wherein the beam collector comprises a collector sweeping apparatus according to claim 12.

* * * * *